United States Patent
Sada et al.

(10) Patent No.: US 6,889,764 B2
(45) Date of Patent: May 10, 2005

(54) COOLING DEVICE AND COOLING METHOD

(75) Inventors: Tetsuya Sada, Kumamoto-ken (JP); Osamu Hirose, Kumamoto (JP); Kiyohisa Tateyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/800,585

(22) Filed: Mar. 8, 2001

(65) Prior Publication Data

US 2001/0017035 A1 Aug. 30, 2001

Related U.S. Application Data

(62) Division of application No. 09/358,459, filed on Jul. 22, 1999, now Pat. No. 6,216,475, which is a division of application No. 08/588,309, filed on Jan. 18, 1996, now Pat. No. 5,941,083.

(30) Foreign Application Priority Data

Jan. 19, 1995 (JP) .............................................. 7-024743
Jan. 17, 1996 (JP) .............................................. 8-24636

(51) Int. Cl.[7] .............................................. F25B 29/00
(52) U.S. Cl. ...................... 165/263; 165/264; 165/80.4; 165/80.5; 165/259; 165/205; 165/206; 62/99; 62/185; 62/434; 62/435
(58) Field of Search ................................ 165/263, 264, 165/259, 80.4, 80.5, 206, 205; 62/185, 434, 435, 99

(56) References Cited

U.S. PATENT DOCUMENTS

| | | | |
|---|---|---|---|
| 3,525,098 A | 8/1970 | Vox | 165/259 |
| 3,735,805 A | 5/1973 | Stillherd | 165/259 |
| 5,601,141 A | 2/1997 | Gordon et al. | 165/236 |
| 5,941,083 A | 8/1999 | Sada et al. | 62/99 |

FOREIGN PATENT DOCUMENTS

JP      6-2262      1/1994
JP      8-63236      * 3/1996

* cited by examiner

*Primary Examiner*—John K. Ford
(74) *Attorney, Agent, or Firm*—Oblon, Spivak, McClelland, Maier & Neustadt, P.C.

(57) ABSTRACT

A cooling device for cooling an object to be processed to a target temperature comprises a plurality of contact members mounted on a placing table, for supporting the object such that the object opposes a top surface of the placing table with an interval, temperature sensors for outputting temperature information of the object supported by the contact members, a first cooling unit for cooling the placing table to a temperature lower than the target temperature to cool the object, a second cooling unit for heating the object cooled by the first cooling unit to a temperature almost equal to the target temperature, and a contrast circuit for performing a switching operation between cooling by the first cooling unit and heating by the second cooling unit on the basis of the temperature information from the temperature sensors.

3 Claims, 8 Drawing Sheets

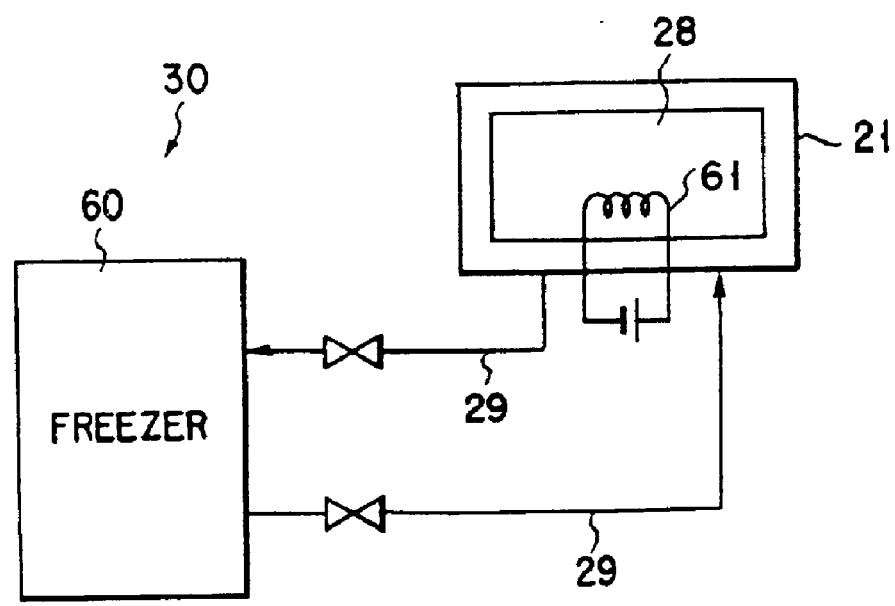
F I G. 6
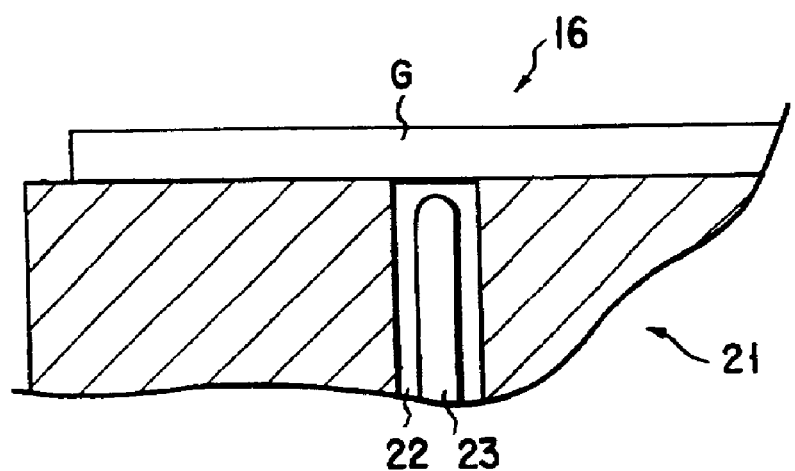
F I G. 7

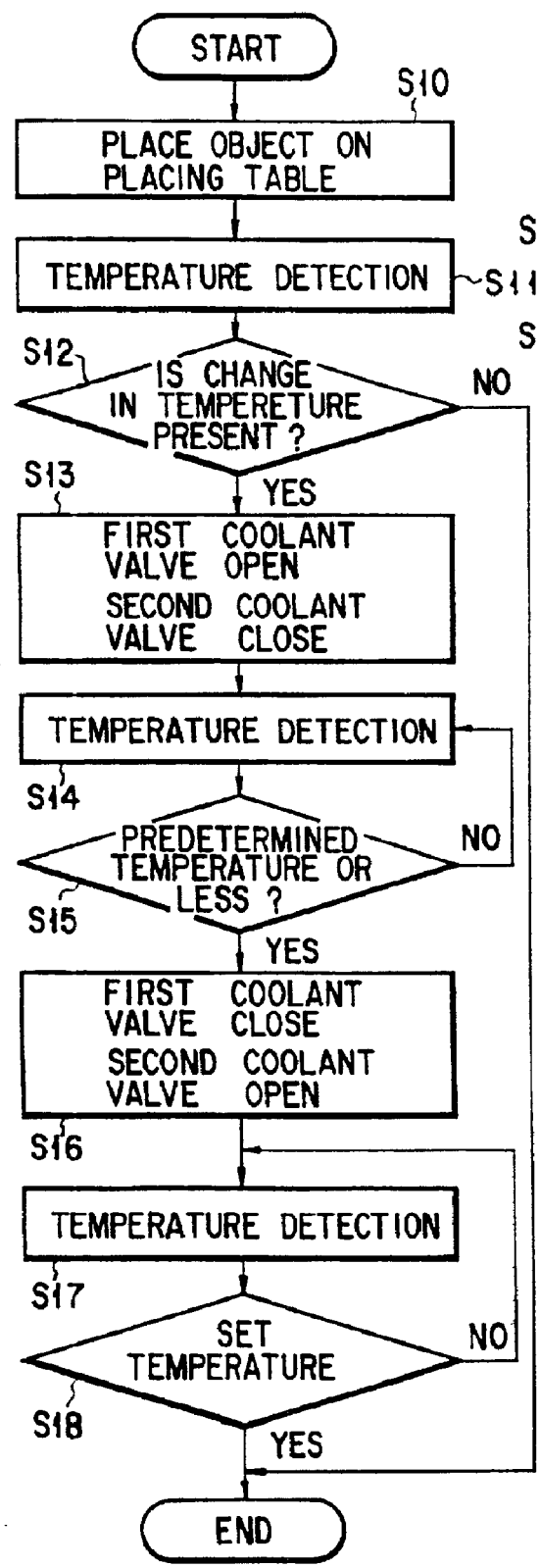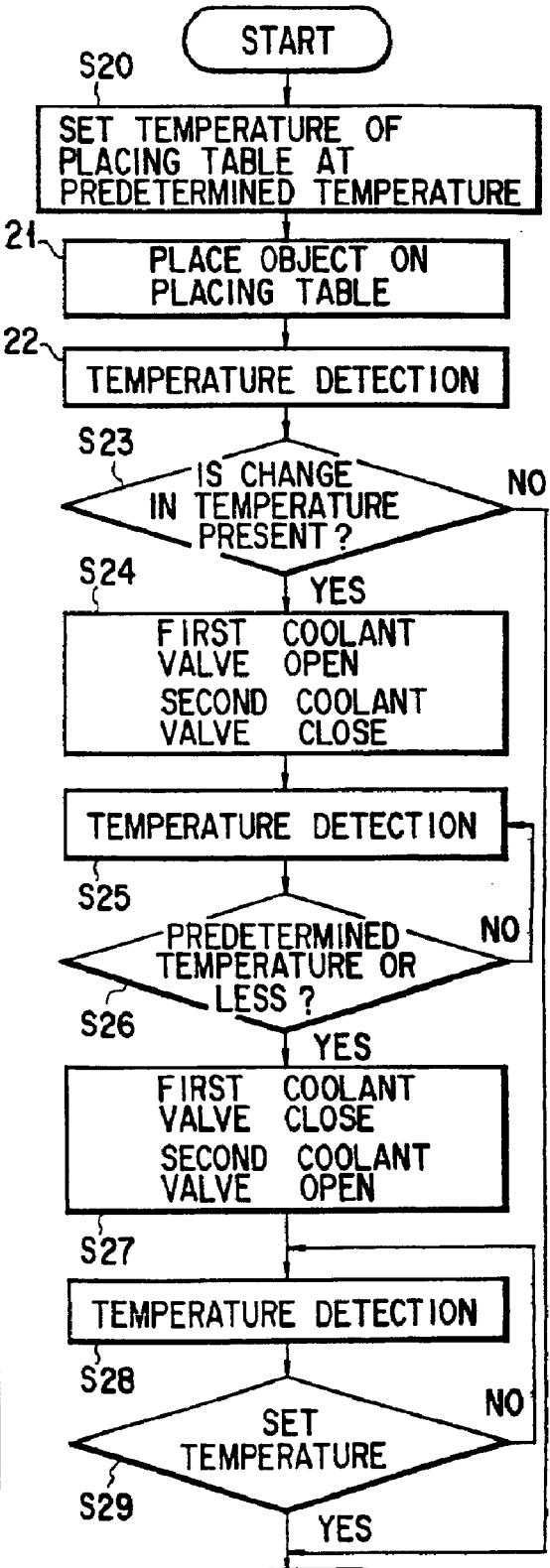
F I G. 8    F I G. 9

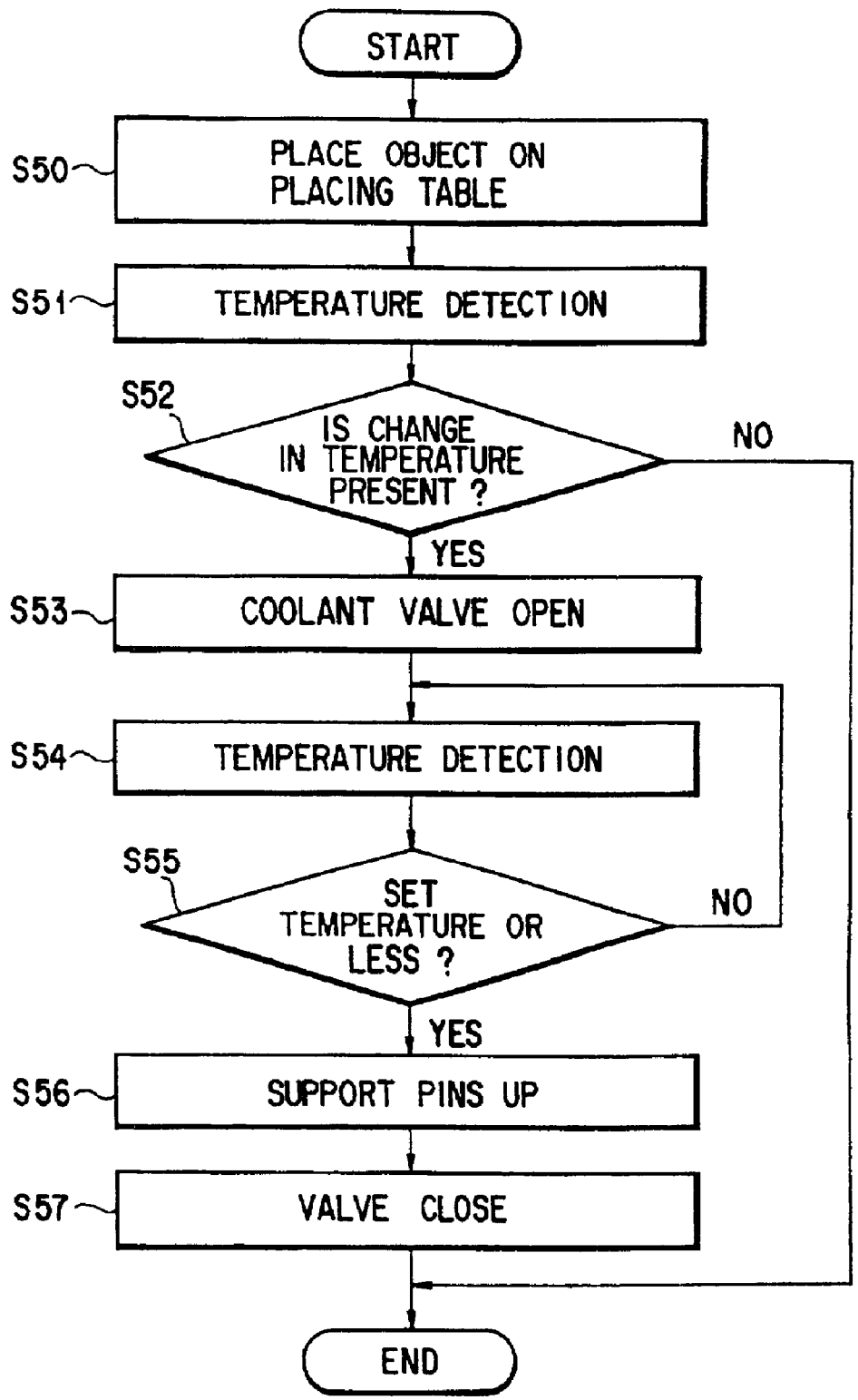
F I G. 14

COOLING DEVICE AND COOLING METHOD

This application is a Division of application Ser. No. 09/358,459 filed on Jul. 22, 1999, now U.S. Pat. No. 6,216,425 now allowed, which is a divisional of application Ser. No. 08/588,309 filed Jan. 18, 1996, now issued as U.S. Pat. No. 5,941,083.

BACKGROUND OF THE INVENTION

1. Field of the Invention

The present invention relates to a method and device for cooling an object to be processed to a target temperature.

2. Description of the Related Art

In general, in the processing steps for, e.g., a semiconductor substrate, a glass substrate, or the like, a series of processes in which a circuit pattern or the like is reduced and transferred to a photoresist on the substrate by using a photolithography technique, and the resultant photoresist is developed are performed. In such processes, the substrate is washed and then heated to completely remove moisture from the substrate surface. After the heating, the heated substrate is quickly cooled to an atmospheric temperature to shorten the manufacturing time. As a cooling device for this purpose, a device disclosed in Japanese Examined Utility Model Publication No. 6-2262 is known.

In conventional cooling device, as indicated by a curve a in FIG. 12, even if control is performed using a coolant kept at a target temperature to cool the substrate having a high temperature K1 to a target temperature K2, a considerably long time (T3) is disadvantageously required to cool the substrate to the target temperature after the temperature of the substrate is close to the target temperature K2. In FIG. 12, the ordinate indicates the temperature (° C.) of the substrate, and the abscissa indicates a time (second). In an example, the temperature K1 is about 130° C., the temperature K2 is about 23° C., and the time T3 is about 60 seconds.

In addition, in the photolithography step described above, the cooling step must be performed for one substrate several times. For this reason, in order to increase a throughput, one important problem is to shorten a time for the cooling process.

SUMMARY OF THE INVENTION

It is an object of the present invention, there is provided a processing method and a processing device capable of shortening a time required to cool an object to be processed to a target temperature when the temperature of the object is to be set a predetermined temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a view for explaining a second coolant supply means constituted by using a freezer;

FIG. 7 is a sectional view showing a part of a placing table which is the same as that in FIG. 4 except that a contact member is not arranged;

FIG. 8 is a flow chart for explaining of the operation of the cooling device in FIG. 1;

FIG. 9 is a flow chart using loading of a glass substrate as trigger;

FIG. 14 is a flow chart for explaining of the operation of the device shown in FIG. 13.

DETAILED DESCRIPTION OF THE PREFERRED EMBODIMENTS

One preferred embodiment of the present invention will be described below such that the present invention is applied to a cooling device used in a resist coating/developing apparatus.

Figure 1:
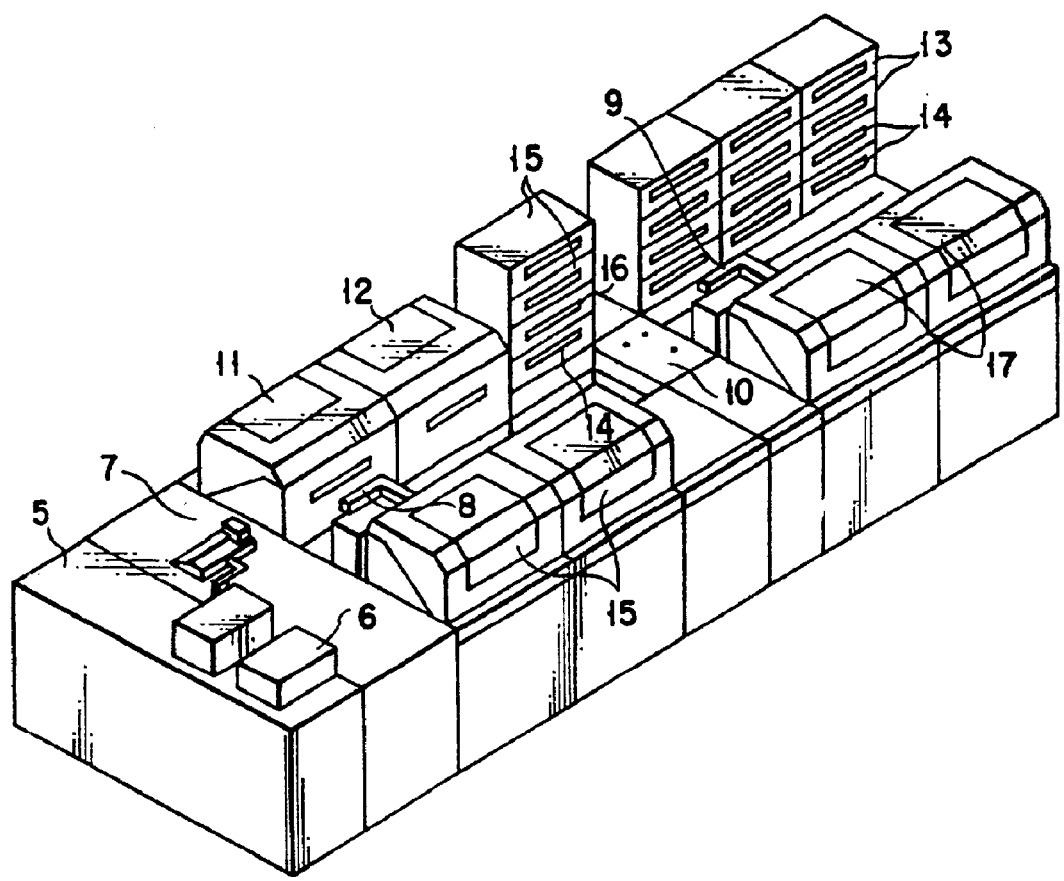
FIG. 1 is a perspective view showing the overall arrangement of a coating/developing apparatus including a cooling device according to one embodiment of the present invention.

The overall arrangement of a coating/developing apparatus comprising a cooling device according to an embodiment of the present invention will be described below with reference to FIG. 1. Referring to FIG. 1, reference numeral 5 denotes a carrier stage, on which carriers 6 each constituted to store a plurality of LCD glass substrates and serving as a storing vessel can be placed, for loading or unloading the carrier 6 into/from the device. Reference numeral 7 denotes a convey mechanism for loading or unloading a glass substrate into/from the carrier 6. Reference numerals 8 and 9 denote main arms serving as convey means for conveying the substrate to process stations; and 10, a repeater for exchanging the glass substrate between the process stations. The glass substrate G in the carrier 6 is conveyed into a washing device 11 through the convey mechanism 7 and the main arm 8, and then the glass substrate G is water-washed with a brush in the device 11, and the glass substrate G is jet-water-washed by a jet water-washing device 12 as needed. Thereafter, the glass substrate G is dried by a heat-processing unit 13, is conveyed into a first cooling device 14 arranged on the lower stage side of the heat-processing unit 13, and is cooled to a predetermined temperature, e.g., an atmospheric temperature. An adhesion processing unit 15 performs a hydrophobic process to the glass substrate, and the glass substrate is cooled to a predetermined temperature by a second cooling device 16 arranged on the lower stage of the adhesion processing unit 15, and a coating device 17 rotationally coats and forms a photoresist film, i.e., a photosensitive film, on the glass substrate. The photoresist film is heated by the heat-processing unit 13 to perform a pre-baking process to the photoresist film, and a predetermined pattern is exposed by an exposure device (not shown) arranged on the right side of this device. The exposed glass substrate is conveyed into a develop processing unit, developed by a developing liquid, and then returned into the carrier 6 through the main arms 8 and 9 and the convey mechanism 7.

The construction of the first and second cooling devices 14 and 16 described above will be described below with reference to FIG. 2. Since the first cooling device 14 basically has the same structure as that of the second cooling device 16, the cooling device 14 is representatively described.

The cooling device 14 comprises a placing table 21 serving as a cooling means, on which a glass substrate G is placed, for cooling it. The placing table 21 consists of a material, e.g., a metal such as aluminum, having good conductivity to rapidly exchange heat between the placing table 21 and a coolant. Three or more through holes 22 which vertically extend are formed in the placing table 21, and a support pin 23 which can be vertically moved in the through hole 22 is arranged in each through hole 22. The support pins 23 are vertically moved by a drive means including a vertically moving plate 24 which commonly supports the support pins 23 and an air cylinder 25 having a drive rod which is connected to the vertically moving plate 24. When a compressed air is supplied from a compressed air supply means (not shown) into the air cylinder 25, the drive rod is moved upward, and the support pins are moved upward accordingly through the vertically moving plate 24, and the upper portions of the support pins extend from the upper surface of the placing table 21. In this state, the glass substrate G held by the main arm 8 (9) described above is conveyed into the cooling device 14, and the glass substrate G is delivered onto the upper end faces of the support pins 23 above the placing surface of the table. Thereafter, when the air in the air cylinder 25 is exhausted, the drive rod is moved downward, and the upper ends of the support pins 23 are moved downward from the upper surface of the placing table. Therefore, the glass substrate G is delivered from the support pins 23 onto the placing surface (upper surface of contact members (to be described) later when the contact members are arranged).

Figure 3:
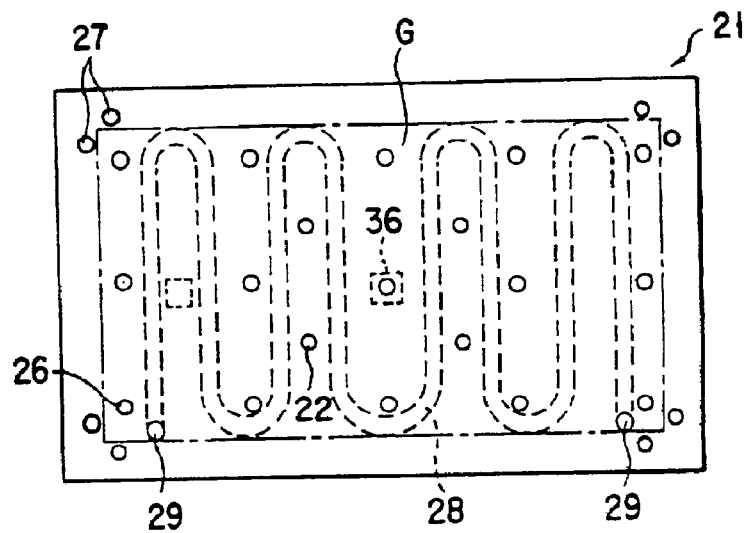
FIG. 3 is a plan view showing a placing table of the cooling device in FIG. 1.

As shown in FIG. 3, four pairs of guide or positioning pins 27 for locating, at a predetermined position, the glass substrate G placed on the placing table 21 according to the size of the glass substrate G. The guide pins 27 are detachably fixed to the upper surface of the placing table 21 by selectively inserting the lower end portions of the guide pins 27 into vertical insertion bores (not shown) formed in the upper surface of the placing table 21. Therefore, even if the glass substrate G is changed in size, positioning of the glass substrate G changed in size can be performed by inserting the guide pins 27 into insertion bores corresponding to the size of the glass substrate G.

Figure 4:
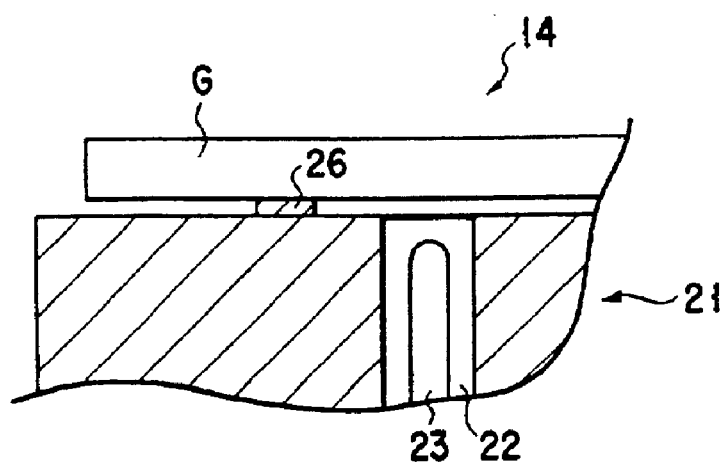
FIG. 4 is a partially enlarged sectional view showing the placing table of the cooling device in FIG. 1.

As shown in FIGS. 3 and 4, the glass substrate G is kept slightly floating from the upper surface of the placing table 21 and opposing the upper surface of the placing table 21 to prevent dust on the upper surface of the placing table 21 from adhering to the glass substrate G, and the placing table 21 has a plurality of contact members 26 arranged on the upper surface of the placing table 21 to suppress accumulation charging of the glass substrate G. Since the glass substrate G is directly placed on the upper surface of the contact members 26, the upper surface of the contact members 26 is defined as a placing surface in this embodiment.

The contact members and placing table constitute a support means for supporting an object to be processed. The contact members 26 can preferably consist of a good conductive material, e.g., a metal such as aluminum, for making the conductivity of heat from the placing table 21 better. The contact members 26 may be formed by members which are as thin (low) as possible, e.g., 0.1 mm or less to rapidly perform thermal conducting in the gap between the upper surface of the placing table 21 and the low surface of the glass substrate G by heat radiation and heat conversion. As such thin contact members, for example, polyimide film pieces which are electrical insulators but can be easily shaped. In order to give the heat conducting effect and charge suppression effect to the insulating contact member, a conductive film such as aluminum film may be coated on the surface of the insulating contact member.

Figure 2:
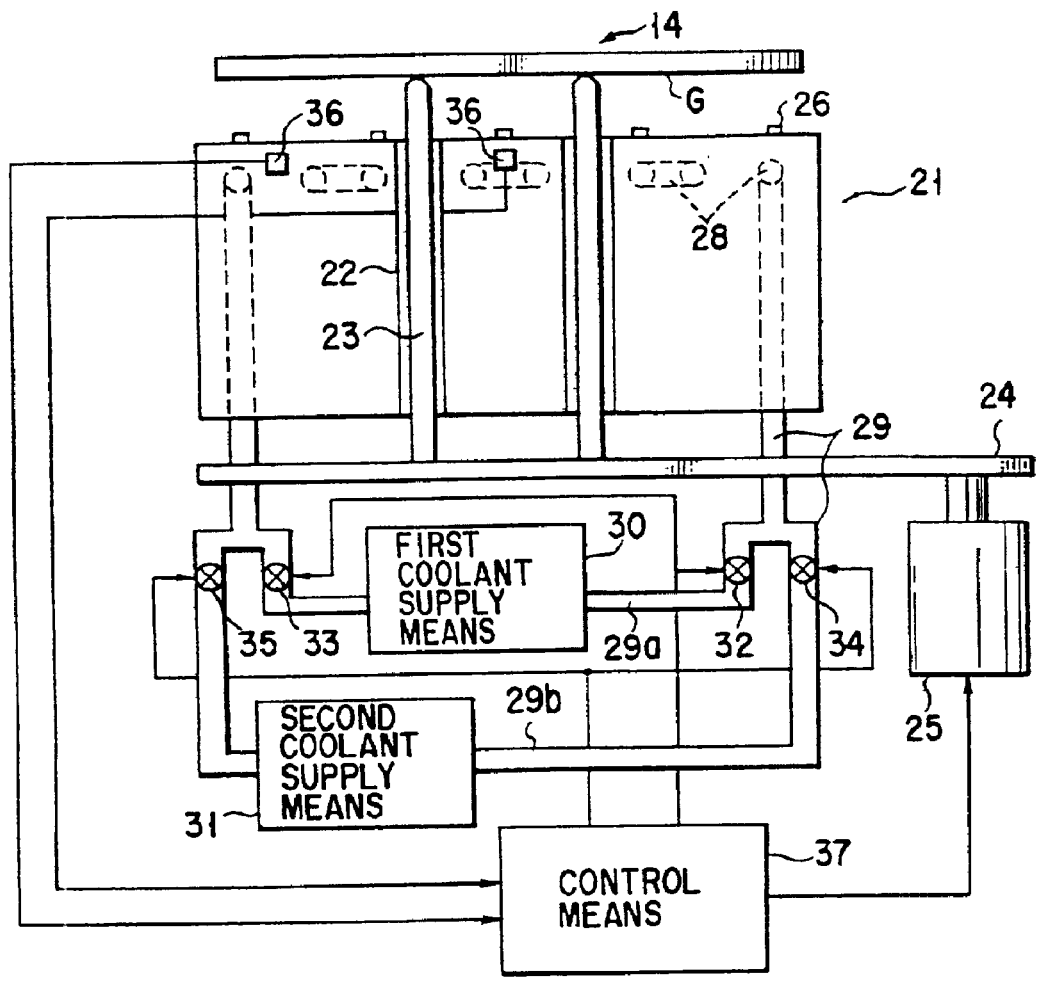
FIG. 2 is a schematic view showing the embodiment of the cooling device in FIG. 1.

Inside the placing table 21, as shown in FIG. 2, a coolant circulating path for circulating a coolant such as cooling water, e.g., a coolant path 28 serving as a cooling unit and the upper portions of a pair of first pipes 29 is arranged. The coolant path 28 is arranged near the upper surface of the placing table 21, as shown in FIG. 3, and the coolant path 28 horizontally extends to wind from one end side to the other end side. The coolant path 28 is not limited to such a shape, but can have various shapes. For example, the coolant path 28 is formed as a rectangular chamber corresponding to the glass substrate. The pipes 29 are connected to both the ends (inlet and outlet) of the coolant path 28, vertically passes through the placing table 21, and extend from the lower surface of the placing table 21 to outside. Both the ends of a second pipe 29a and a third pipe 29b are commonly connected to the other end of the first pipe 29. The second pipe 29a has a first coolant supply means 30 for causing a first coolant, e.g., cooling water, to flow into the second pipe 29a, and the third pipe 29b has a second coolant supply means 31 for causing a second coolant, e.g., cooling water, to flow into the third pipe 29b. As a result, the first supply means 30, the first pipes 29, and the second pipe 29a constitute a first coolant supply unit for supplying the first coolant into the coolant path 28 to circulate the first coolant. The second supply means 31, the first pipes 29, and the third pipe 29b constitute a second coolant supply unit for supplying the second coolant into the coolant path 28. A pair of first electromagnetic valves 32 and 33 are arranged at the portions of the second pipe 29as near the connection portion between the second pipe 29a and the first pipes 29, and a pair of second electromagnetic valves 34 and 35 are arranged at the portions of the third pipe 29bs near the connection portion between the third pipe 29b and the first pipes 29. The four electromagnetic valves are connected to a control means (CPU) 37 and opened/closed on the basis of a command from this control means, thereby making it possible to selectively supply the first and second coolants into the coolant path 28. More specifically, when, according to a command from the control means 37, the first electromagnetic valves 32 and 33 are opened, and the second electromagnetic valves 34 and 35 are closed, the first coolant is supplied from the first supply unit into the coolant path 28. In contrast to this, when the first electromagnetic valves 32 and 33 are closed, and the second electromagnetic valves 34 and 35 are opened, the second coolant is supplied from the second supply unit into the coolant path 28.

The first coolant supply means 30 supplies a coolant having a temperature lower than a temperature at which the glass substrate G is cooled, i.e., a target temperature (K2 in FIG. 12), into the coolant path 28. As a coolant used in the first coolant supply means 30, for example, water cooled to a temperature of, e.g., about 18° C., city water, or other liquid can be selected. In place of the above cooling method, the following method can be used. That is, a coolant consisting of a gas such as a fleon gas is supplied into the coolant path 28 to operate the placing table 21 as an evaporator, thereby performing cooling using latent heat.

Figure 5:
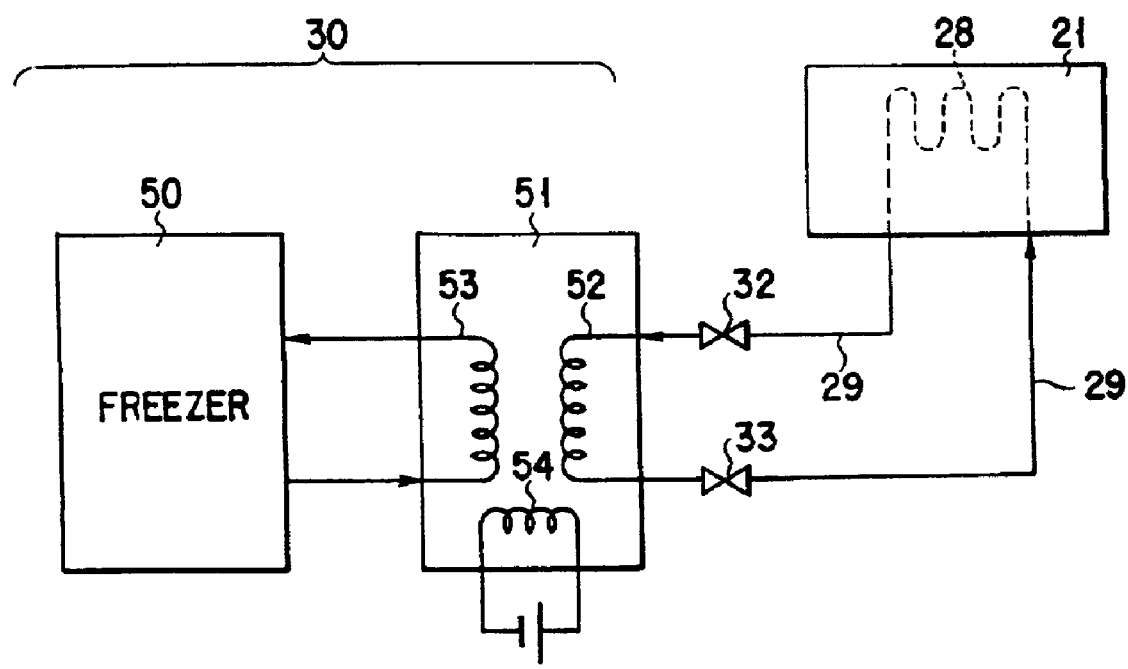
FIG. 5 is a view for explaining a first coolant supply means constituted by using a freezer and a heat exchanger.

As shown in FIG. 5, for example, the first coolant supply means 30 can be constituted by a freezer 50 and a heat exchanger 51. In this device, both the ends of the second pipe 29a are connected to each other by a primary coil 52 of the heat exchanger 51. A secondary coil 53 of the heat exchanger is connected to the freezer 50 to supply a low-temperature coolant formed by the freezer. As a result, in the heat exchanger, the coolant flowing in the primary coil 52 is cooled to the target temperature K2 or less by the low-temperature coolant flowing in the secondary coil 53, and the cooled coolant is caused to flow into the coolant path 28 through the first electromagnetic valves 32 and 33. The coolant warmed by the glass substrate, in the coolant path 28 is cooled in the primary coil 52 and supplied into the cooling path again. In order to prevent the first coolant flowing in the primary coil 52 of the heat exchanger 51 from being excessively cooled, an auxiliary heater 54 is arranged in the heat exchanger. The auxiliary heater 54 receives a temperature information signal from a temperature detection means (to be described later), and can be controlled by the control means 37. In place of this method, the freezer 50 may be ON/OFF-controlled by the control means 37, or both of the auxiliary heater 54 and the freezer 50 may be controlled by the control means 37.

In place of the above arrangement, for example, as shown in FIG. 6, the first coolant supply means 30 may be constituted by only a freezer 60. In this example, as shown in FIG. 6, a cavity having a relatively large capacity is formed in the placing table 21, and the overall cavity rules the coolant path 28. An auxiliary heater 61 is arranged in the coolant path 28 to prevent the placing table 21 from being excessively cooled. This heater 61 (including the freezer 60 as needed) can be controlled by the control means 37 as in the example shown in FIG. 5. According to the example shown in FIG. 6, the first coolant can be cooled to a low temperature, and the glass substrate can be cooled at a high speed. In addition, spontaneous conversion of the first coolant occurs in the coolant path 28 to make thermal diffusion uniform, and not only the placing table 21 but also the glass substrate can be entirely, uniformly cooled.

As described above, the various arrangements may be employed as the arrangement of the first coolant supply means 3. However, if the cooling device is arranged in a high-humidity atmosphere, when a coolant having an extremely low temperature is supplied from the first coolant supply means 30 into the placing table 21, dew condensation may occurs on the outer surface of the placing table 21 or the outer peripheral surface of the pipes 29. When such dew condensation occurs, accurate temperature control cannot be easily performed due to the heat of evaporation of the dew condensation. For this reason, in this environment a coolant having a low temperature at which the view condensation does not occur, e.g., about 18° C., is preferably supplied from the first coolant supply means 30 into the coolant path 28.

The second coolant supply means 31 is set to supply a coolant having a temperature almost equal to the target temperature at which the glass substrate G is cooled in to the coolant path 28. More specifically, when the target temperature for cooling the glass substrate is about 23° C., the second coolant supply means 31 supplies and circulates a coolant having a temperature of about 23° C., e.g., constant-temperature water having a temperature of 23° C., into the coolant path 28 through a second supply path.

As shown in FIG. 2, a temperature detection means such as a temperature sensor, e.g., a thermo couple 36 is arranged at least one portion in the placing table 21, near the surface on which the substrate is placed. The temperature sensors 36 are preferably arranged at the central and peripheral portions on (in) at least the upper surface of the substrate to accurately measure a temperature distribution in the plane of the substrate. Temperature informations detected by these temperature sensors 36 are transmitted to the control means 37 as an electrical signals not only to open/close the first and second electromagnetic valves 32 to 35 to control the auxiliary heater 54 (61) and the freezer 50 (60) as needed. When a plurality of temperature sensors are used, for example, an average temperature can be used as temperature information.

Since the basic arrangement of the second cooling device 16 is substantially the same as that of the first cooling device 14 shown in FIG. 2 except for the point described below, a detailed description of the second cooling device 16 will be omitted. In this cooling device 16, as shown in FIG. 7, unlike the first cooling device 14, the contact members 26 are not arranged, the upper surface of the placing table 21 is used as a placing surface, and the glass substrate G is directly placed on the upper surface of the placing table 21. As a result, the cooling device 16 can cool the glass substrate G as a whole without ununiformity.

The operation of the above processing device will be described below with reference to the flow charts shown in FIGS. 8 to 11.

In the processing device in FIG. 1, the glass substrate G is held by the main arm 8 from the carrier 6, conveyed into the washing device 11, water-washed with a brush, and jet-water-washed by a jet water-washing device 12 as needed. Thereafter, the glass substrate G is conveyed into the heat-processing unit 13. After the glass substrate G which is heat-processed at a temperature of about 90° C. or more in the heat-processing unit 13 is unloaded from the heat-processing unit 1 by the main arm 9, the glass substrate G is conveyed into the cooling device 14 and then delivered by pre-programmed procedures onto the upper ends of the support pins 23 which extend from the upper surface of the placing table 21 and are on standby. Thereafter, the main arm 9 is withdrawn from the cooling device 14.

In the cooling device 14, the following processes are performed according to the flow charts shown in FIGS. 8 to 11. The processing steps shown in FIG. 8 will be described below. The operation of the air cylinder 25 is started. In step S10, the support pins 23 having upper surfaces which support the glass substrate G are moved downward, and the glass substrate G is placed on the placing surface of the placing table 21. At this time, the temperature of the placing table 21 is kept at the target temperature; K2, e.g., atmospheric temperature, e.g., 23° C.

In step S11, the temperature sensors 36 intermittently or continuously detect the temperature near the upper surface of the placing table 21. In step S12, the control means 37 checks, on the basis of the detected temperature detection signal, whether the temperature of the placing surface is changed by placing the substrate G on the placing surface. If NO in step S12, the control means 37 determines that the temperature of the glass substrate G is atmospheric temperature to stop the cooling process, and the control means 37 restarts driving of the air cylinder to move the support pins 23 upward, in order to convey the glass substrate G to the next processing step. On the other hand, when an ascending temperature near the upper surface of the placing table 21 is detected by the temperature sensors 36, a cooling process is started in step S13. More specifically, the second electromagnetic valves 34 and 35 are closed by a control signal from the control means 37 which receives the temperature detection signal, and then, or at the same time, the first electromagnetic valves 32 and 33 are opened. The first coolant having a temperature (e.g., 18° C.) which is lower than the target temperature (e.g., 23° C.) and at which dew condensation does not occur, is supplied and circulated into the coolant path 28 in the placing table 21 through the first supply path. As a result, the glass substrate G is quickly cooled. This cooling is continued while the temperature near the upper surface of the placing table 21 is detected by the temperature sensors 36. When the control means 37 determines, on the basis of the temperature detection signal, that the temperature of the glass substrate G becomes the target temperature or less (step S15), the control means 37, at the same time or a predetermined time after, transmits a control signal to the switching means or valves 32 to 35, and, at the same time or after the second coolant having the target temperature (e.g., 23° C.) is supplied, stops the supply of the first coolant (step S16). More specifically, the first electromagnetic valves 32 and 33 are closed, and the second electromagnetic valves 34 and 35 are opened. When the first coolant is switched to the second coolant, the temperature of the glass substrate G can be quickly controlled to be the target temperature while the temperature is detected by the temperature sensors 36 (step S17). When the control means 37 detects that the temperature reaches the target temperature through the temperature sensors 36 (step S16), driving of the air cylinder 25 is restarted to move the glass substrate G upward from the placing surface of the placing table 21. The glass substrate G is unloaded from the cooling device 14 by the main arm 9 serving as a convey means, and the flow is shifted to, e.g., an adhesion processing step (to be described later).

The processing step shown in FIG. 9 will be described below. Before the glass substrate G is placed on the placing table 21, in step S20, a coolant having a predetermined temperature, e.g., 23° C. is supplied from the second coolant supply means 31 into the coolant path 28 of the placing table 21 in advance by opening the second electromagnetic valves 34 and 35 to set the temperature of the placing table 21 at a predetermined temperature. In step S21, the support pins 23 are moved downward to place the glass substrate G on the placing table 21. In step S22, the temperature sensors 36 detect a temperature near the upper surface of the placing table 21, and in step S23, the control means 37 checks whether the temperature of the placing surface changes. If NO in step S23, a cooling process is stopped, the glass substrate G is conveyed to the next processing step. On the other hand, when the temperature ascends in step S24, the second electromagnetic valves 34 and 35 are closed, and the first electromagnetic valves 32 and 33 are opened to supply a first coolant having a temperature lower than a predetermined temperature, e.g., 18° C., from the first coolant supply means 30 into the coolant path 28. In step S24, as a timing at which the supply of the coolants is switched, for example, the coolant supply may be switched simultaneously with a change in temperature of the placing table 21 by placing the glass substrate G on the placing table 21, otherwise, the coolant supply may be switched a predetermined time after the change in temperature of the placing table 21 is detected.

According to the processing steps shown in FIG. 9, a change in temperature of the placing table 21 is used as a trigger, the first coolant is supplied into the coolant path 28 the moment of the temperature changes or a predetermined time after the temperature changes, thereby making it possible to quickly cool the glass substrate G. When the temperature of the glass substrate G becomes lower than a predetermined temperature, e.g., 23° C., in step S26, the second electromagnetic valves 34 and 35 are opened and the first electromagnetic valves 32 and 33 are closed in step S27 to supply a coolant having a predetermined temperature, e.g., 23° C., from the second coolant supply means 31 into the coolant path 28. When it is detected in step S29 that the temperature of the glass substrate G becomes the predetermined temperature, it is determined that the cooling process is finished. In this manner, the glass substrate G cooled to the predetermined temperature is unloaded from the cooling device 14 by the main arm 9 serving as the convey means, and the flow is shifted to, e.g., an adhesion processing step (to be described later).

The processing steps shown in FIG. 10 will be described below. In the processing steps, as in the processing steps shown in FIG. 9, before the glass substrate G is placed on the placing table 2, in step S30, a coolant having a predetermined temperature, e.g., 23° C. is supplied from the second coolant supply means 31 into the coolant path 28 of the placing table 21 in advance to set the temperature of the placing table 21 at a predetermined temperature. In step S31, the glass substrate G is loaded onto the placing table 21 by the main arm serving as a convey means and delivered to the support pins 21. Thereafter, the support pins 23 are moved downward to place the glass substrate G on the placing table 21. In step S31 or before or after step S31, the second electromagnetic valves 34 and 35 are closed and the first electromagnetic valves 32 and 33 are opened in step S32 to supply a coolant having a temperature lower than a predetermined temperature, e.g., 18° C. from the first coolant supply means 30 into the coolant path 28. In step S32, as a timing at which the supply of the coolant is switched, for example, the coolant supply may be switched the moment a proper sensor (not shown) detects that the glass substrate G is loaded onto the placing table 21, otherwise, the coolant supply may be switched a predetermined time after the sensor detects that the glass substrate G is loaded onto the placing table 21. In addition, for example, the coolant supply may be switched the moment a command for loading the glass substrate G into the cooling device 14 is output to the main arm 9, otherwise, the coolant supply may be switched a predetermined time after the command for loading the glass substrate G into the cooling device 14 is output.

Figures 10, 11:
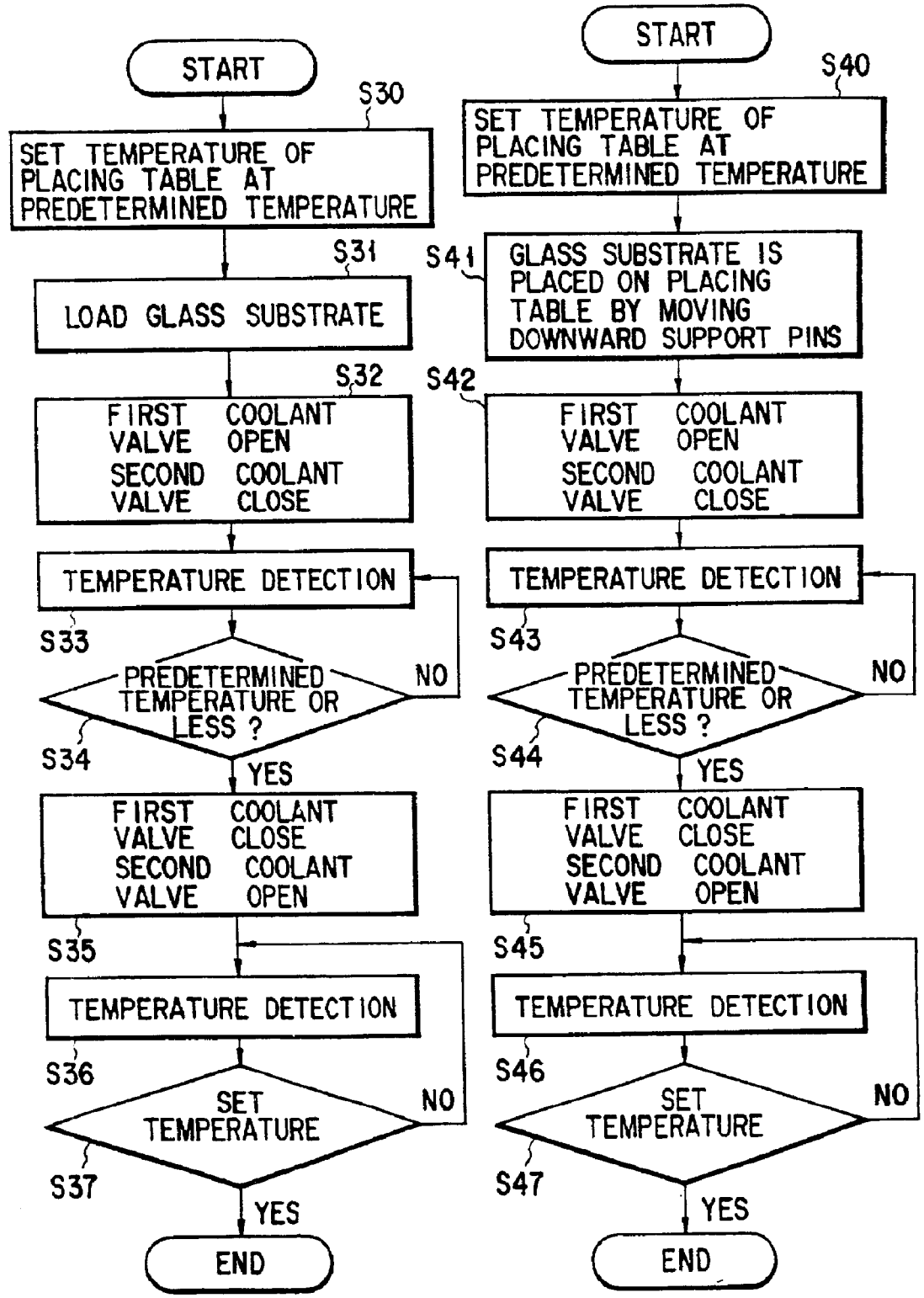
FIG. 10 is a flow chart using loading of a glass substrate by a convey means as trigger.
FIG. 11 is a flow chart using descending of a delivering means.

According to the processing steps shown in FIG. 10, when the first coolant is supplied into the coolant path 28 at a predetermined timing by using loading of the glass substrate G as a trigger, the glass substrate G placed on the placing table 21 can be quickly cooled. When the temperature of the glass substrate G becomes lower than a predetermined temperature, e.g., 23° C., in step S34, the second electromagnetic valves 34 and 35 are opened and the first electromagnetic valves 32 and 33 are closed in step S35 to supply the second coolant having a predetermined temperature, e.g., 23° C., from the second coolant supply means 31 into the coolant path 28. The temperature of the placing table 21 is detected (step S36). When it is determined that the temperature of the glass substrate G becomes the predetermined temperature (23° C.), the cooling process is finished. In this manner, the glass substrate G cooled to the predetermined temperature is unloaded from the cooling device 14 by the main arm 9 serving as the convey means, and the flow is shifted to, e.g., an adhesion processing step (to be described later).

The processing steps shown in FIG. 11 will be described below. In this step, as in the processing steps shown in FIGS. 9 and 10, before the glass substrate G is placed on the placing table 21, in step S40, a coolant having a predetermined temperature, e.g., 23° C. is supplied from the second coolant supply means 31 into the coolant path 28 of the placing table 21 in advance to set the temperature of the placing table 21 at a predetermined temperature. In step S41, the glass substrate G which is delivered by the main arm 9 serving as a convey means is placed on the placing table 21 by moving the support pins 23 downward. In step S41 or after step S41, the second electromagnetic valves 34 and 35 are closed and the first electromagnetic valves 32 and 33 are opened in step S42 to supply a coolant having a temperature lower than a predetermined temperature, e.g., 18° C. from the first coolant supply means 30 into the coolant path 28. In step S42, as a timing at which the supply of the coolant is switched, for example, the coolant supply may be switched by using, as a trigger, a command for starting the downward movement of the support pins 23, otherwise, the coolant supply may be switched a predetermined time after the command for starting the downward movement. In addition, when downward movement of the support pins 23 or the glass substrate G is detected by using, e.g., a proper sensor (not shown), the coolant supply may be switched by using the detection as a trigger.

In this manner, according to the processing steps shown in FIG. 11, when the first coolant is supplied into the coolant path 28 at a predetermined timing by using the downward movement of the support pins 23 as a trigger, the glass substrate G placed on the placing table 21 can be quickly cooled. In step S44, when the temperature of the glass substrate G becomes lower than a predetermined temperature, e.g., 23° C., the second electromagnetic valves 34 and 35 are opened and the first electromagnetic valves 32 and 33 are closed in step S45 to supply a coolant having a predetermined temperature, e.g., 23° C., from the second coolant supply means 31 into the coolant path 28 of the placing table 21. When it is determined in steps S46 and S47 that the temperature of the glass substrate G becomes a predetermined temperature, it is determined that the cooling process is finished, the glass substrate G cooled to the predetermined temperature is unloaded from the cooling device 14 by the main arm 9 serving as the convey means, and the flow is shifted to, e.g., an adhesion processing step (to be described later).

In this manner, one of a series of processing steps of photolithography, e.g., an adhesion process is performed to the glass substrate G which is cooled to the predetermined temperature according to any step of the steps shown in FIGS. 8 to 11 described above and which is unloaded from the cooling device 14 by the main arm 9 serving as a convey means. The glass substrate G is conveyed into the adhesion processing unit 15 by the main arm 8, and a hydrophobic process is performed to the glass substrate G.

Thereafter, the glass substrate G is conveyed into the second cooling device 16, a cooling process according to the same steps as those described in FIGS. 8 to 11. In the cooling process in the cooling device 16, the glass substrate G is directly placed on the placing surface of the placing table 21 as described above. The temperature distribution of the glass substrate G cooled by the cooling device 16 is more uniform than that of the glass substrate G cooled by the cooling device 14. This is because, when the temperature distribution is not uniform in the coating step serving as the next step, a coating film having a uniform thickness cannot be formed. In the cooling device 14 described above, the contact members 26 are used to suppress contamination adhering to the placing table 21 from adhering to the glass substrate G, and the cooling process is performed. However, in the cooling device 16 used in the cooling step before the coating step, in order to making uniformity of the temperature distribution good, the glass substrate G is directly placed on the placing surface of the placing table 21.

In order to suppress the contamination of the placing table 21 of the second cooling device 16 from adhering to the glass substrate G, an air, $N_2$ gas, or the like is sprayed on the placing surface of the placing table before the glass substrate G is placed on the placing table 21, a means for removing contamination is preferably arranged.

After the temperature of the glass substrate G is set at the predetermined temperature, the glass substrate G is unloaded from the cooling device 16 by the main arm 8 shown in FIG. 1, the glass substrate G is loaded into other devices 11, 12, 13, 15, and 17 shown in FIG. 1 according to a predetermined program, and predetermined processes are performed to the glass substrate G.

Figure 12:
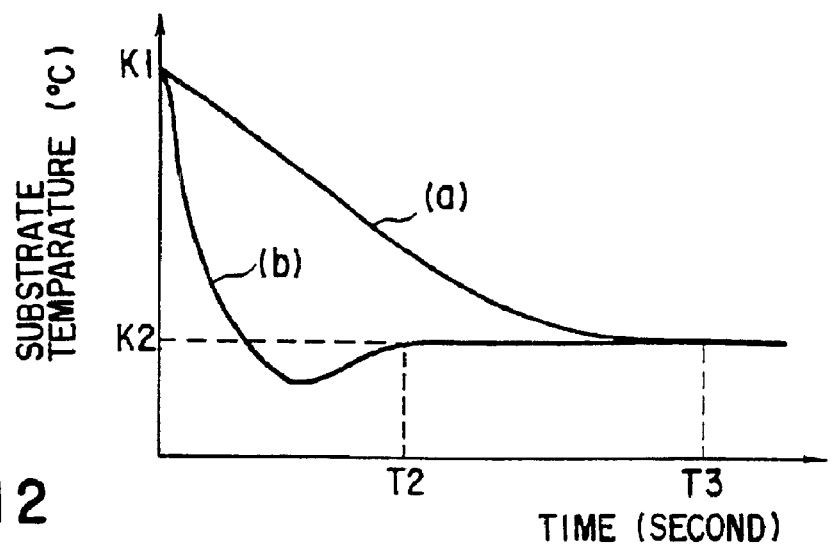
FIG. 12 is a graph showing the operations of processes in the convention device and the embodiment of the present invention.

The effects of the cooling devices 14 and 16 will be described below with reference to FIG. 12 described in the description of the prior art.

In the cooling process of the present invention, as indicated by a curve (b), after the glass substrate is quickly cooled to the temperature K2 or less by the first coolant having a temperature kept at the temperature K2 or less, the temperature of the substrate is adjusted to the temperature K2 by using the second coolant having a temperature kept at the temperature K2. As a result, unlike the case of the conventional cooling device indicated by a curve (a), the temperature is not asymptotic to the temperature K2. For this reason, as is apparent from comparison between the curves (a) and (b), the cooling time of the substrate G can be shortened by a time corresponding to (T3–T2).

As described above, the placing table 21 is cooled by the first coolant having a temperature lower than a predetermined temperature, the glass substrate G is cooled to the target temperature or less, and the first coolant is switched to the second coolant having a temperature almost equal to the predetermined temperature by the electromagnetic valves 32, 33, 34, and 35 to supply the second coolant. For this reason, since the temperature of the glass substrate G can be set at the predetermined temperature within a short time, a time required for a large number of cooling steps in the series of photography steps can be shortened, and a throughput can be considerably increased.

Since the contact members 26 consisting of a material having good heat conductivity are arranged at at least a plurality of positions at equal intervals between the glass substrate G and the placing table 21 of the cooling device 14, the glass substrate G can be uniformly cooled in the cooling steps. Therefore, the contact members 26 can contribute to improvement of the processing quality of the glass substrate G and an increase in yield.

When the contact members 26 consist of a good conductive material, e.g., a metal such as aluminum, the cold of the placing table 21 can be efficiently conducted to the glass substrate G, and the cooling effect for the glass substrate G can be improved. In contrast to this, when the contact members 26 consists of an insulating material, e.g., a polyimide film, the thickness of the polyimide film is as thin as possible, e.g., 0.1 mm or less. For this reason, heat conduction by radiation and conversion between the placing table 21 and the glass substrate G can be quickly performed, and a time required for the cooling steps is shortened, thereby contributing to an increase in throughput.

In the cooling step before the coating step, the glass substrate G is directly placed on the placing table 21. For this reason, uniformity of the temperature distribution in the cooling process is improved, and a coating film can be uniformly formed in the coating step following the cooling step. A preferable effect is given to the various processes in the subsequent steps, e.g., an exposing process, thereby increasing a yield.

Another embodiment different from the cooling devices 14 and 16 described above will be described below with reference to FIGS. 13 and 14. The same reference numerals as in the cooling device described in FIG. 2 denote the same parts in FIG. 13, and a description thereof will be omitted.

Figure 13:
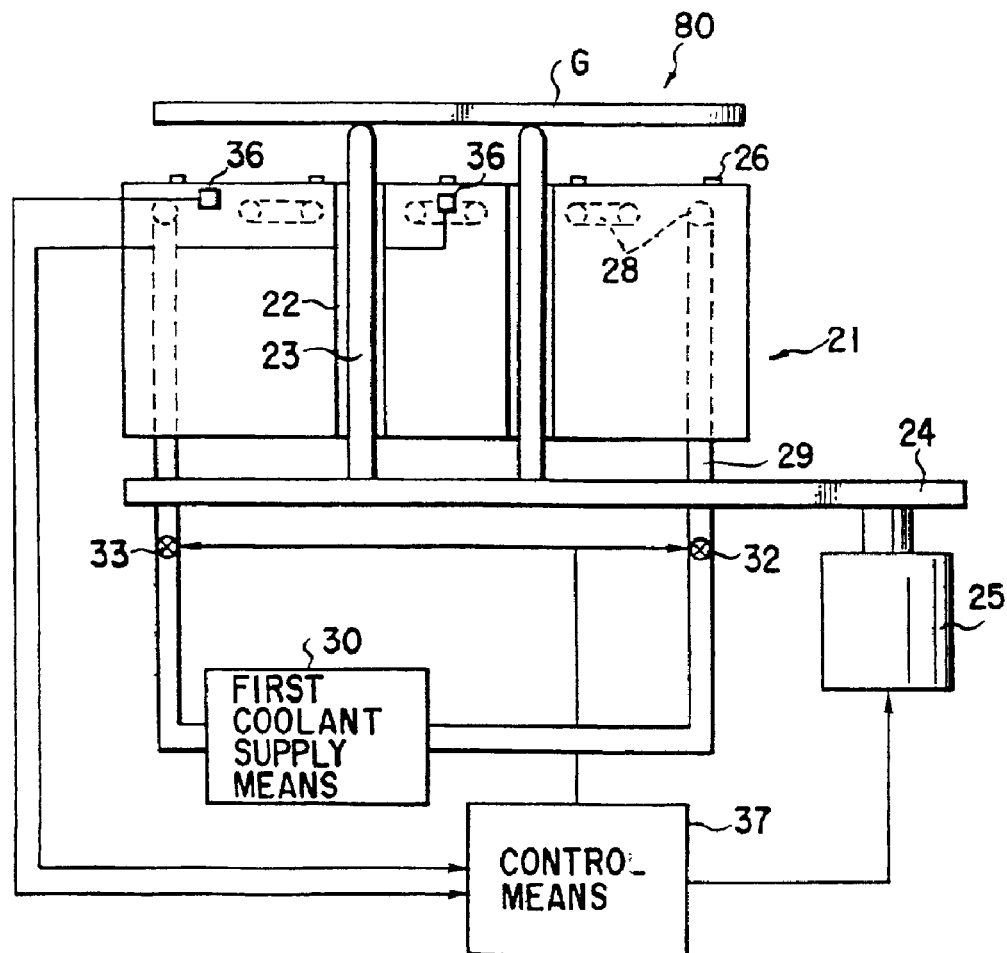
FIG. 13 is a view for explaining a device according to another embodiment of the present invention.

In a cooling device 80 shown in FIG. 13, a first coolant supply means 30 for supplying and circulating a coolant having a temperature kept at a target temperature for cooling the glass substrate G, e.g., about 18° C., into a coolant path 28 inside a placing table 21, and electromagnetic valves 32 and 33 serving as a means for opening/closing the coolant supply means 30 are arranged as a coolant cooling means and a switching means, respectively. The coolant used in this case is, for example, a cooling liquid or gas described above. In this embodiment, as is apparent from FIG. 13, the second coolant supply means 31 of the device in the above embodiment and equipments related to the second coolant supply means 31 are not arranged.

In the cooling device, the following processing step is performed. In the processing device shown in FIG. 1, as in the device described above, the glass substrate G is unloaded from the carrier 6 through the convey mechanism 7 and the main arm 8, and the glass substrate G is water-washed with a brush in the device 11, and the glass substrate G is jet-water-washed by a jet water-washing device 12 as needed. Thereafter, the heat-processing unit 13 performs a heating process to the glass substrate G at a temperature of about 90° C. or more. The glass substrate G is unloaded from the heat-processing unit 13 by the main arm 9 and loaded into the cooling device 80 arranged as shown in FIG. 13. In the cooling device 80, the glass substrate G is delivered by pre-programmed procedures onto the upper ends of the support pins 23 which extend from the upper surface of the placing table 21 and are on standby. After the main arm 9 delivers the glass substrate G onto the support pins 23, the main arm 9 is withdrawn from the cooling device 80.

In the cooling device 80, the following processes are performed according to the flow chart shown in FIG. 14. More specifically, in step S50, the support pins 23 are moved downward, and the glass substrate G serving as an object to be processed is placed on the placing table 21. The temperature of the placing table 21 is kept at the temperature of an atmosphere in which the cooling device 80 is arranged, i.e., atmospheric temperature, e.g., 23° C. In step S51, the temperature sensors 36 intermittently or continuously detect the temperature the placing surface of the placing table 21. In step S52, the control means 37 checks, on the basis of the detected temperature detection signal, whether the temperature of the placing surface is changed by placing the substrate G on the placing surface. If NO in step S52, the control means 37 determines that the temperature of the glass substrate G is atmospheric temperature to convey the glass substrate G, the control means 37 drives the air cylinder 25 to move the support pins 23 upward, in order to convey the glass substrate G to the next step. On the other hand, when a change in temperature, e.g., temperature ascending occurs, the cooling process is started in step S53. More specifically, the electromagnetic valves 32 and 33 are opened in response to a control signal from the control means 37 which receives the temperature detecting signal to supply a coolant having a temperature kept at atmospheric temperature or less, e.g., 18° C., into the coolant path 28 in the placing table 21, and not only the placing table 21 but also the glass substrate G are quickly cooled. In addition, after temperature detection is performed in step S54, the control means 37 checks, through the temperature sensors 36, whether the temperature of the glass substrate G becomes lower than a predetermined temperature, e.g., 23° C., (step S55). If NO in step S55, the control means 37 determines that the cooling process-is not sufficiently performed, and the cooling process is continued until the temperature becomes lower than 23° C., i.e., the coolant continuously flows into the cooling path. On the other hand, when the control means 37 detects that the temperature of the placing table 21 becomes lower than 23° C., the control means 37 transmits a control signal to the switching means 32 and 33 the moment the temperature becomes lower than 23° C. or a predetermined after the temperature becomes lower than 23° C. to stop the supply of the coolant (S57). Simultaneously with step S56 or before or after step S56, the control means 37 transmits a control signal for upward driving to the air cylinder 25 in step S56, and the support pins 23 moved upward accordingly separates the glass substrate G from the placing table 21. In this state, when the glass substrate G is exposed in a room-temperature atmosphere for a predetermined time, the temperature of the glass substrate G is set at a predetermined temperature, e.g., 23° C. Since the time for this step is properly set as temperature change characteristics by the side of the glass substrate, time, the interval between the glass substrate and the upper surface of the placing table, when such information is input to the control means in advance, the optimum time can be automatically set. When the control means 37 determines, on the basis of the temperature change characteristic information, that the temperature of the glass substrate G becomes 23° C., the glass substrate G is unloaded at a predetermined timing from the cooling device 14 by the main arms 8 and 9 serving as a convey means. Thereafter, the support pins 23 are kept at the upper position to be on standby for the next glass substrate which is to be conveyed. Therefore, when the substrate G is cooled to 23° C. or less and then exposed in a 23° C. atmosphere, quick temperature control can be performed, and a throughput can be increased.

In the cooling device 80 described in FIG. 13, as described in FIG. 9, the coolant is supplied into the coolant path 28 the moment the temperature of the placing table 21 is changed by loading the glass substrate G onto the placing table 21 or a predetermined time after the temperature of the placing table 21 is changed, otherwise, as in the case described with reference to FIG. 10, the coolant may be supplied into the coolant path 28 the moment the glass substrate G is loaded onto the placing table 21 or a predetermined time after the glass substrate G is loaded onto the placing table 21. In addition, as in the case described with reference to FIG. 11, the coolant may be supplied into the coolant path 28 the moment the support pins 23 are moved downward or a predetermined after the support pins 23 are moved downward. After the glass substrate G is cooled to a predetermined temperature or less as described above, the glass substrate G is exposed in an atmosphere of a predetermined temperature, thereby setting the temperature of the glass substrate G at a predetermined temperature.

In either of the above embodiments, although the glass substrate is exemplified as a substrate to be processed, the substrate is not limited to the glass substrate, other substrates such as a semiconductor wafer, a printed board, a glass mask, and the like may be used. In order to peel the glass substrate G from the placing table 21, when an $N_2$ gas is supplied between the glass substrate G and the placing table 21 to eliminate a residual pressure, the glass substrate G can be easily peeled from the placing table 21. In this case, the $N_2$ gas may be supplied onto the upper surface of the placing table 21 through the through holes 22, formed in the placing table 21, for vertically moving the support pins 23. When ions formed by an ionizer are mixed with the $N_2$ gas, static electricity generated by peeling the glass substrate G from the placing table 21 can be prevented. Furthermore, in order to cool the glass substrate G placed on the placing table 21, an inverter type cooling device or a non-inverter type cooling device may also be used. In this case, an auxiliary heater is effectively used to control the cooling temperature at a high accuracy. A method in which a cooler is brought into contact with or close to the placing table 21 to perform a quick cooling operation may also be used. When the cooler is close to the placing table 21, the cooling temperature or cooling speed can be controlled by adjusting the distance between the cooler and the placing table 21.

As in the first cooling device, when a thin-plate-like object to be processed such as a glass substrate is placed on the contact members 26 to cool the object, the object is easily bent, and the interval between the upper surface of the placing table 21 and the lower surface of the object is made ununiform. For this reason, ununiform cooling may be performed, or the object may not be cooled to a desired temperature. Therefore, in consideration of bending of the object, a curved recessed portion corresponding to the bending may be formed between the contact members on the upper surface of the placing table 21. When the object is brought into direct contact with the upper surface of the placing table as in the second cooling device, the pressure between the object and the upper surface of the mounting table is made negative to enhance the degree of contact between the object and the placing table, thereby making it possible to perform uniform temperature control.

In either of the above embodiments, although the coolant having a temperature lower than the target temperature is used as a cooling means for cooling an object to be processed to the target temperature or less, a cooling means using another physical phenomenon, e.g., an electrical means such as a Peltier element, may be used such that the electrical means is arranged on the placing table. In addition, when the temperatures of not only the placing table but also the object are measured, the cooling means is ON/OFF-controlled by the control means 37, and a switching operation between the cooling means and a heating means for heating the cooled object to a temperature almost equal to the target temperature is performed by the control means 37. However, without measuring the temperature, and all or some of the operation timings may be controlled by preformed monitor data through a control means. For example, the relationships among the temperature of the object to be cooled, the start time of the cooling means, and time at which the cooling means is switched to the second cooling means are calculated by experiment, and the resultant data is input to the control means in advance. The cooling means and/or the heating means may be controlled on the basis of the stored information.

In the above embodiments, the temperature detecting means is provided in the placing table; however, it may be provided near the top end of the support pin or pins 23 or at the main arm by which the glass substrate is carried to the support pins. The temperature of the glass substrate can thus be measured directly. Furthermore, the glass substrate being carried to the support pins by the main arm can be precooled by blowing cooling gas such as $N_2$ gas thereonto. The temperature of the precooling can be set to any value between the initial heating temperature and target temperature and determined by both the carrying time of the glass substrate using the main arm and the blowing temperature of the cooling gas.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cooling method for cooling a substrate loaded on a placing table by supplying a coolant having a temperature lower than a target temperature into a coolant path arranged in said placing table, comprising:

loading the substrate on the placing table while setting in advance the temperature of the placing table at a temperature substantially equal to the target temperature;

starting the supply of the coolant in the coolant path when the temperature of the placing table changes or a predetermined time passes after the temperature of the placing table changed, thereby cooling the placing table together with the substrate; and unloading the substrate from the placing table after the temperature of the placing table is rendered equal to or lower than the target temperature, and heating the substrate to the target temperature in an atmosphere having a temperature substantially equal to the target temperature.

2. A cooling method for cooling a substrate loaded on a placing table by supplying a coolant having a temperature lower than a target temperature into a coolant path arranged in said placing table, comprising:

loading the substrate on the placing table while setting in advance the temperature of the placing table at a temperature substantially equal to the target temperature;

starting the supply of the coolant in the coolant path when the substrate is loaded on the placing table or when a predetermined time passes after the substrate was loaded on the placing table, thereby cooling the placing table together with the substrate; and unloading the substrate from the placing table after the temperature of the placing table is rendered equal to or lower than the target temperature, and heating the substrate to the target temperature in an atmosphere having a temperature substantially equal to the target temperature.

3. A cooling method for cooling a substrate loaded on a placing table by supplying a coolant having a temperature lower than a target temperature into a coolant path arranged in said placing table, comprising:

loading the substrate on the placing table while setting in advance the temperature of the placing table at a temperature substantially equal to the target temperature;

starting the supply of the coolant in the coolant path when, after the substrate is received by means of a plurality of support pins above the placing table, and the support pins are descended, or when a predetermined time passes after the support pins are descended, thereby cooling the placing table together with the substrate; and unloading the substrate from the placing table after the temperature of the placing table is rendered equal to or lower than the target temperature, and heating the substrate to the target temperature in an atmosphere having a temperature substantially equal to the target temperature.

* * * * *